United States Patent
Keller (12)

(10) Patent No.: US 6,431,899 B1
(45) Date of Patent: Aug. 13, 2002

(54) SOCKET ASSEMBLY

(75) Inventor: Rex W. Keller, Gilbert, AZ (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/558,685

(22) Filed: Apr. 24, 2000

(51) Int. Cl.$^7$ .......................................... H01R 13/625
(52) U.S. Cl. ...................................................... 439/342
(58) Field of Search ................................. 439/259, 342, 439/260, 261, 262, 263, 264, 265, 267

(56) References Cited

U.S. PATENT DOCUMENTS

| | | | | |
|---|---|---|---|---|
| 4,217,020 A | | 8/1980 | Holland .................... 339/75 M |
| 4,375,309 A | | 3/1983 | Griffin ...................... 339/75 M |
| 4,420,205 A | | 12/1983 | Kirkman ................... 339/74 R |
| 4,988,310 A | * | 1/1991 | Bright et al. ............... 439/342 |
| 5,013,256 A | | 5/1991 | Matsuoka et al. .......... 439/264 |
| 5,167,515 A | | 12/1992 | Matsuoka et al. .......... 439/108 |
| 5,370,549 A | | 12/1994 | Lee ............................ 439/342 |
| 5,387,121 A | | 2/1995 | Kurz .......................... 439/342 |
| 5,443,591 A | * | 8/1995 | Tsai ........................... 439/342 |
| 5,569,045 A | * | 10/1996 | Hsu ........................... 439/342 |
| 5,597,318 A | | 1/1997 | Townsend .................. 439/342 |
| 5,622,514 A | * | 4/1997 | Crompton, III et al. .... 439/342 |
| 5,658,160 A | | 8/1997 | Lai ............................ 439/342 |
| 5,679,020 A | * | 10/1997 | Lai et al. ................... 439/342 |
| 5,697,803 A | | 12/1997 | Kistner et al. .............. 439/342 |
| 5,762,511 A | * | 6/1998 | Scheitz et al. .............. 439/342 |
| 5,791,928 A | * | 8/1998 | Lai ............................ 439/342 |
| 5,833,483 A | | 11/1998 | Lai et al. .................... 439/342 |
| 6,168,449 B1 | * | 1/2001 | Huang et al. ............... 439/259 |
| 6,186,815 B1 | * | 2/2001 | Lin ............................ 439/342 |

* cited by examiner

Primary Examiner—Brian Sircus
Assistant Examiner—Thanh-Tam Le
(74) Attorney, Agent, or Firm—Woodcock Washburn LLP

(57) ABSTRACT

A socket assembly comprising a base having a plurality of electrical contacts connectable to a circuit board, and a cover having a plurality of apertures. The cover is movable between a rearward (open) position, and a frontward (closed) position. In the open position, the apertures receive male contacts from an electronic component, for example a pin grid array package, such that the male contacts encounter no frictional resistance to their insertion into the apertures. In the closed position, the male contacts are held in a position of electrical connection with the contacts in the base. As the cover moves from the open to the closed position, it pushes the male contacts and base contacts together in a manner such that the base contacts "wipe" against the male contacts, thus removing debris and contaminants from the electrical contact region. In the closed position, electrical connection between the male contact and the base contact exists over a continuous length of their respective surfaces, thus providing a large electrical contact region for good conduction of electrical impulses.

12 Claims, 9 Drawing Sheets

SOCKET ASSEMBLY

FIELD OF THE INVENTION

The present invention relates generally to the field of electrical connectors, and, more particularly, to a Zero Insertion Force (ZIF) socket assembly.

BACKGROUND OF THE INVENTION

Integrated circuits (ICs) are becoming smaller, more complex, and more prevalent. It is common for a modern electronic appliance, such as a computer, a video cassette recorder, or even a refrigerator, to have several IC components attached to a circuit board. Each IC is generally delivered as an enclosed package with a pin grid array (PGA) interface. The PGA interface is a set of electrically conductive pins arranged in a pattern, where each pin is an electrical connection to the functional portion of the IC. In order to install the IC in an electronic appliance, the pins must be electrically connected to appliance's main circuit board. It is thus desirable for there to be a simple mechanism that permits the IC to be quickly and easily attached to the circuit board, while minimizing the risk of damage.

One device that permits a simple, fast connection between an IC and a circuit board is a Zero Insertion Force (ZIF) socket assembly. A ZIF socket assembly is a device having set of contacts in electrical connection with the circuit board, where the contacts are disposed in a set of sockets. The device is arranged such that the pins of the IC can be inserted into the sockets without touching the contacts so that the pins do not encounter frictional resistance as they are inserted. Subsequent to the insertion of the pins, the device brings the pins and contacts into electrical connection, such that electrical impulses can flow freely between the pins and the circuit board by way of the contacts.

A number of ZIF socket devices have been proposed. A typical ZIF socket assembly has a contact which either touches the pin at a bend (see, e.g., Griffin, U.S. Pat. No. 4,375,309) or which crosses the pin so as to touch the pin only at a single point (see, e.g., Bright, et al., U.S. Pat. No. 4,988,310). These devices are not well-adapted for small scale PGAs (e.g., a PGA having pins arranged in a grid on centers spaced 0.050 inches apart) because the electrical contact region formed is small, and its effective size may be reduced even further by debris and contaminants which interfere with electrical conduction. While this type of connection may be acceptable for large-scale PGAs, when the PGA is miniaturized to the scale of about 0.050 inch centers, the small electrical contact region that results when the pin and contact touch only at a point may cause the quality of the electrical connection to be poor. By allowing the contact and the pin to touch each other over a continuous length of their surfaces, as well as wiping the contact and pin against each other to remove some debris and contaminants, the quality of the electrical connection for small-scale PGAs is improved.

SUMMARY OF THE INVENTION

A ZIF socket assembly in accordance with the invention allows for a small (e.g. 0.050 inch centers) PGA package to be brought into low-resistance electrical connection with a circuit board without the pins of the PGA encountering frictional resistance as contact is made. The ZIF socket assembly comprises a top plate and a base plate, each made of an electrically insulating material. The base plate has a plurality of contacts arranged in a pattern, each contact being disposed in an opening in the base plate. Each electrical contact has an adjoining tail which extends downward from the base plate and is electrically connectable to a circuit board. Each contact also has a portion that extends upward from the base plate which makes electrical contact with the pins of a PGA package that is to be received by the ZIF socket assembly.

The top plate, which has a plurality of apertures arranged in the same pattern as the contacts, is slidably attached over the base plate, such that it can move between a first position and a second position. Each socket has a narrow upper portion and a wide lower portion. Each contact is received in the wide lower portion of a corresponding aperture. When the top plate is in the first position, a PGA package with pins arranged in the same pattern as the contacts and apertures can be inserted into the top plate through the narrow upper portions of the apertures. As the pins are inserted, the narrow portions of the sockets guide the pins past the contacts so that the pins do not touch the contacts, thereby allowing the pins to be inserted with substantially no frictional resistance.

After the pins have been inserted into the sockets, the top plate is slid over the base plate from the first position to the second position, thereby causing the pins and contacts to be pushed together. The ZIF socket assembly preferably includes either a handle-driven cam mechanism which provides the force necessary to slide the top plate from the first position to the second position, or a set of slits into which a flat-tipped screwdriver may be received to provide the necessary force. Each contact includes two straight portions joined at a bend. As each pin moves closer to a contact, it pushes against the bend and deflects the contact so as to bring one of the straight portions of the contact into vertical alignment with the surface of the pin, such that the straight portion and the pin are in physical connection over a continuous length of their respective surfaces. As the contact is being deflected and brought into physical contact with the pin, the contact wipes against the pin, thereby removing contaminants and debris from the electrical contact region. The continuous length over which contact is made, as well as the wiping action, combine to form a good, low-resistance electrical connection between pins and contacts.

Other features of the invention are described below.

BRIEF DESCRIPTION OF THE DRAWINGS

The foregoing summary, as well as the following detailed description of preferred embodiments, is better understood when read in conjunction with the appended drawings. For the purpose of illustrating the invention, there is shown in the drawings exemplary constructions of the invention; however, the invention is not limited to the specific methods and instrumentalities disclosed. In the drawings.

DETAILED DESCRIPTION OF THE INVENTION

Figure 1:
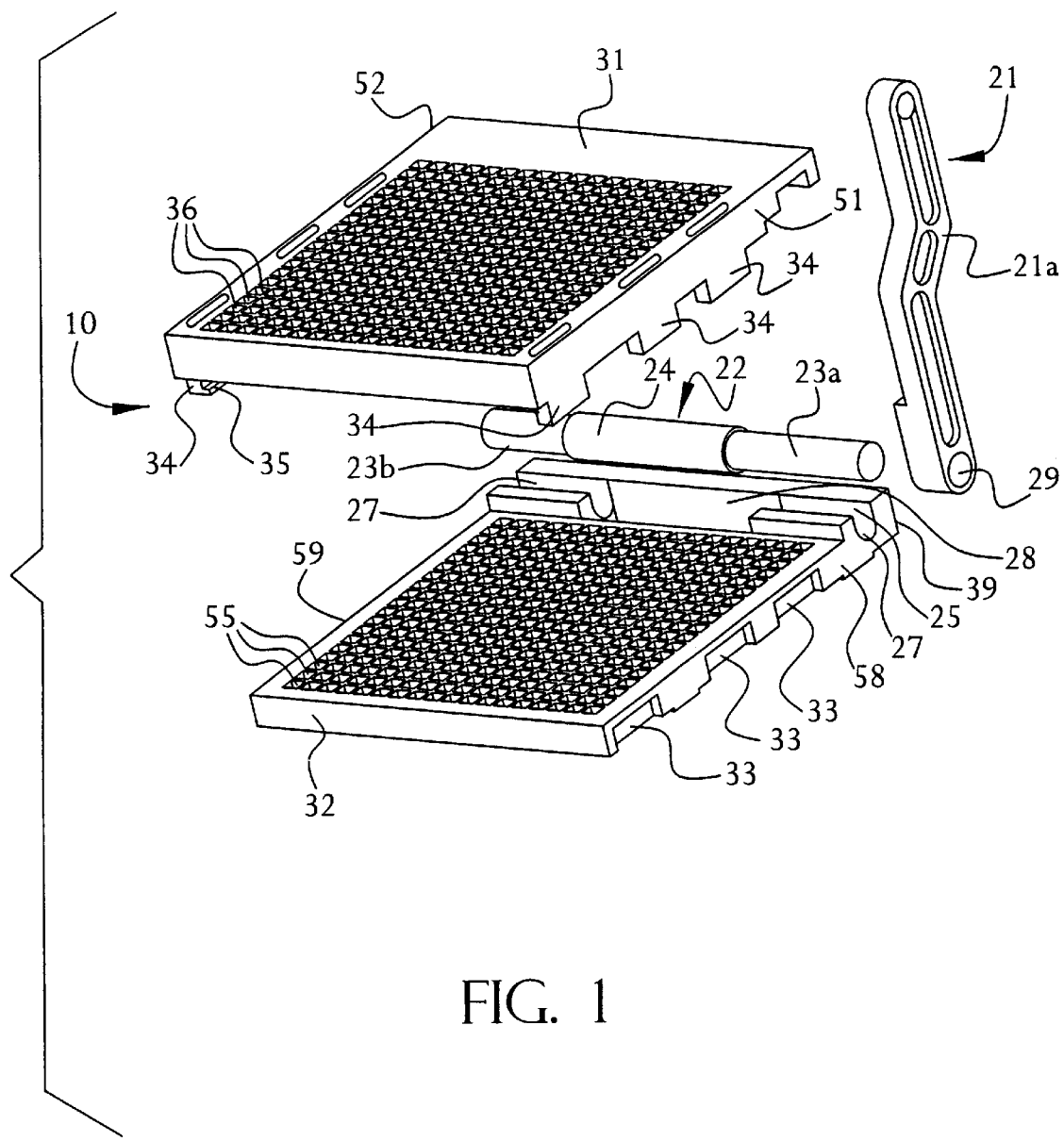
FIG. 1 is an exploded view of a ZIF socket assembly according to the present invention, including an exemplary camming means for transforming the ZIF socket assembly between two positions, the ZIF socket assembly being shown without contacts.

An exemplary Zero-Insertion Force (ZIF) socket assembly 10 according to aspects of the invention comprises a top plate (or "cover") 31 having a plurality of lead-in openings 36, a base plate 32 having a plurality of openings 55, and a plurality of electrical contacts 40 disposed in openings 55. Top plate 31 and base plate 32 may be made of an electrically insulating material, preferably LCP plastic. Electrical contacts are made of an electrically conductive material, preferably a copper alloy with suitable plating. Openings 36 are arranged in any desired pattern in top plate 31, and openings 55 are arranged in an identical pattern in base plate 32. The pattern in which openings 36 and 55 are arranged corresponds to the arrangement of male contacts 61 of an electrical component, such as pin grid array package 60, that is to be inserted into openings 36. In a preferred arrangement, openings 36 and 55 are arranged in a rectangular grid pattern on 0.040- to 0.060-inch centers (i.e., the center of each opening 36 is between 0.040 and 0.060 inches away from the center a horizontally or vertically adjacent opening 36), with openings 36 having a 0.020-inch square opening. More preferably, openings 36 and 55 are arranged in a rectangular grid pattern having 0.050 inch centers.

Figure 2:
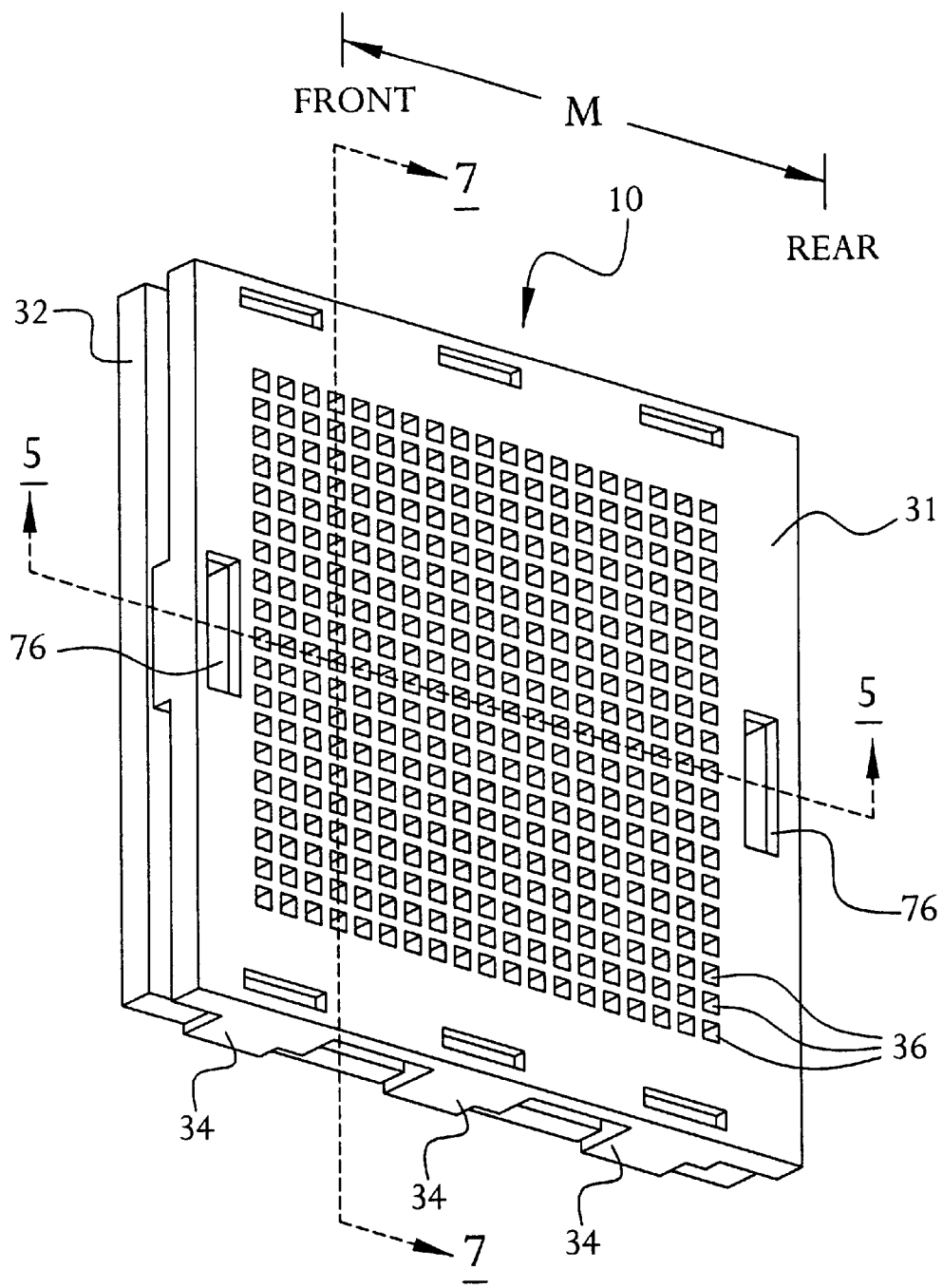
FIG. 2 is a perspective view of an alternative embodiment of a ZIF socket assembly in its first (open) position, using a different method for socket actuation.
Figure 3:
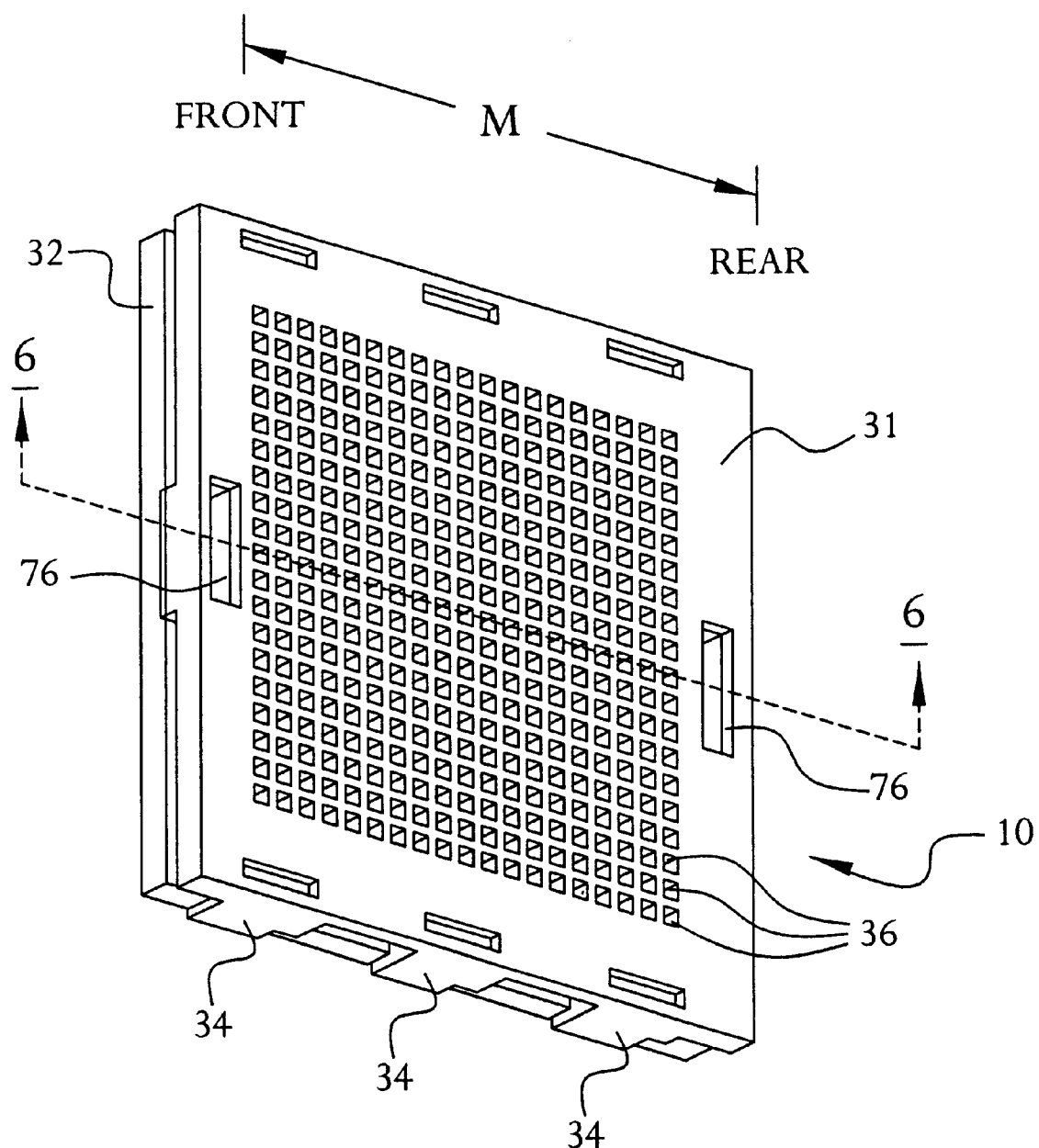
FIG. 3 is a perspective view of a ZIF socket assembly in its second (closed) position.
Figure 4:
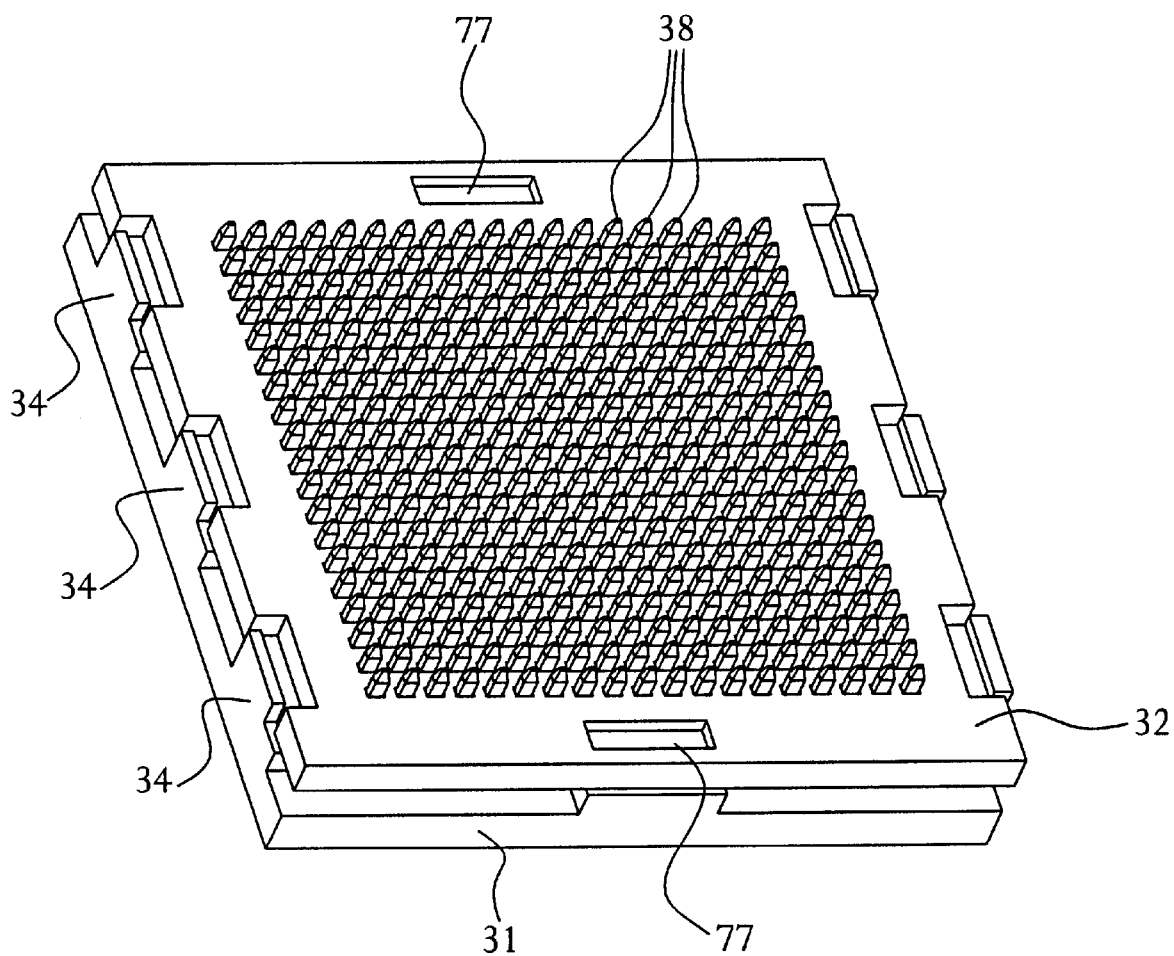
FIG. 4 is a perspective view of a ZIF socket assembly, showing the side of the base plate from which the leads extend.

Top plate 31 is slidably connected to base plate 32. Top plate 31 has a pair of sides 51 and 52, which lie parallel to each other and are disposed on opposing sides of top plate 31. One or more guide members 34 depend from each of sides 51 and 52. Each guide member 34 includes a protrusion 35, which extends perpendicularly from the guide member 34 toward the center of top plate 31. Base plate 32 has sides 58 and 59, which lie parallel to each other and are disposed on opposing sides of base plate 32. One or more tracks 33 are formed in each of sides 58 and 59. Preferably, the number of tracks 33 on side 58 of base plate 32 is equal to the number of guide members 34 on side 51 of top plate 31, and the number of tracks 33 on side 59 of base plate 32 is equal to the number of guide members 34 on side 52 of top plate 31. In this configuration, each track has a guide member 34 to be received within it. Tracks 33 slidably receive guide members 34. The length L1 of each guide member 34 is shorter than the length L2 of each track 33 by a distance D. Therefore, as each guide member 34 slides in its respective track 33, it is able to move through a distance D, thereby permitting top plate 31 to move relative to base plate 32 along axis M through distance D. By moving frontward or rearward a distance D along axis M, top plate 31 is able to assume two distinct positions relative to base plate 32: a frontward position (shown in FIGS. 3 and 6), and a rearward position (shown in FIGS. 2 and 5). When top plate 31 is in its rearward position relative to base plate 32, ZIF socket assembly 10 is said to be in its "open" position. When top plate 31 is in its frontward position relative to base plate 32, ZIF socket assembly 10 is said to be in its "closed" position.

Base plate 32 has a plurality of contact openings 55. As noted above, contact openings 55 are arranged in the same pattern as lead-in openings 36 such that, when top plate 31 is in slidable disposition over base plate 32, it is possible to slide top plate 31 over base plate 32 into such a position that each lead-in opening 36 lies directly over a corresponding contact openings 55.

Disposed in each contact opening 55 is a contact 40 having a tail 38 to electrically connect the electronic component to a circuit board on which ZIF socket assembly 10 mounts. Each contact 40 comprises a straight lower portion 43, a transitional U-shaped portion 41, and a bent upper portion 42. Bent upper portion 42 comprises a lower segment 42a, a bend 42b, and a distal segment 42c. Bent upper portion 42 extends upwardly from U-shaped portion 41 at an oblique angle toward the rear of ZIF socket assembly 10, until it reaches bend 42b, from where it extends upwardly but at an angle toward the front of ZIF socket assembly 10. U-shaped portion 41 and bent upper portion 42 of contact 40 are received in opening 36.

Figure 5:
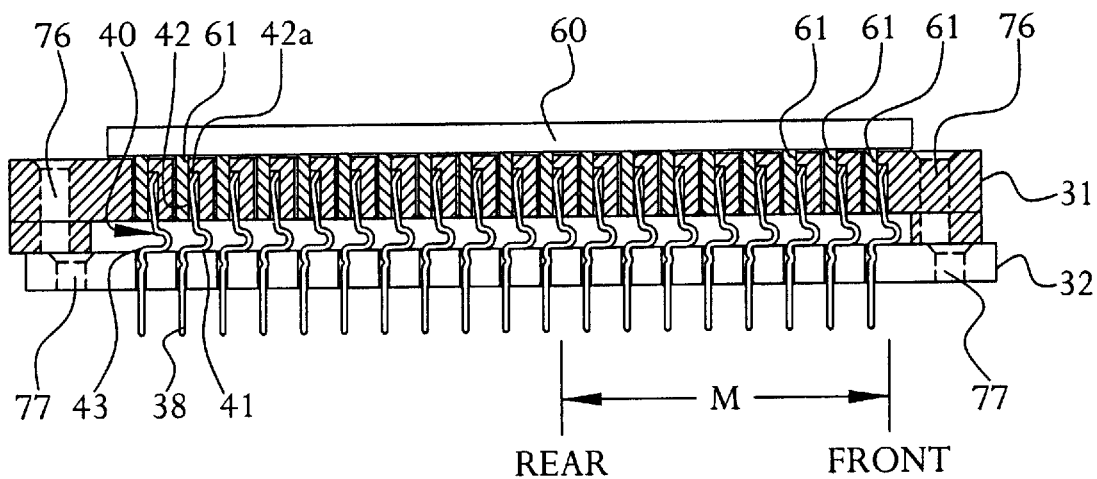
FIG. 5 is a sectional view of the ZIF socket assembly shown in FIG. 2 in its first (open) position, taken along line 5—5, with an exemplary pin grid array package inserted into the ZIF socket assembly.
Figure 6:
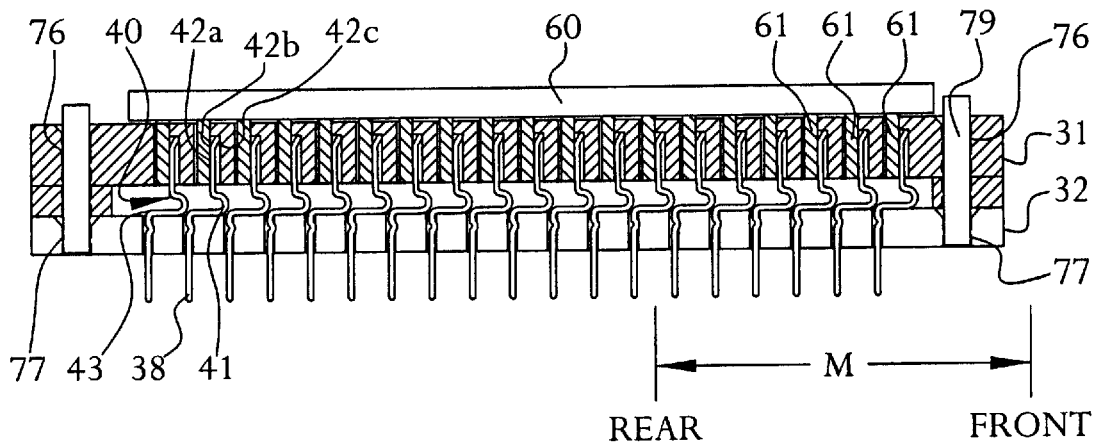
FIG. 6 is a sectional view of the ZIF socket assembly shown in FIG. 3 in its second (closed) position, taken along line 6—6, with an exemplary pin grid array package inserted into the ZIF socket assembly.

Each opening 36 is a square or rectangular cavity formed in top plate 31 and defined by a set of four walls. The frontward wall 48 of each opening 36 is three-tiered, having a rearward section 48a toward the top of opening 36, a median section 48b, and a frontward section 48c toward the bottom of opening 36. The other three walls 47 defining opening 36 are straight (untiered). Owing to the three-tiered arrangement of frontward wall 48, each opening 36 has a narrow portion 45, a middle-width portion 46, and a wide portion 44. Wide portion 44 of opening 36 receives U-shaped portion 41 of contact 40. Middle-width portion 46 of opening 36 receives bent upper portion 42 of contact 40. Tiered wall 48 has a horizontal section 49 between rearward portion 48a and median portion 48b. When ZIF socket assembly 10 is in its open position (as depicted in FIG. 5), horizontal section 49 covers bent upper portion 42 of contact 40, thus preventing stubbing of bent upper portion 42 by pin 61 while pin 61 is being inserted into opening 36.

Figure 7:
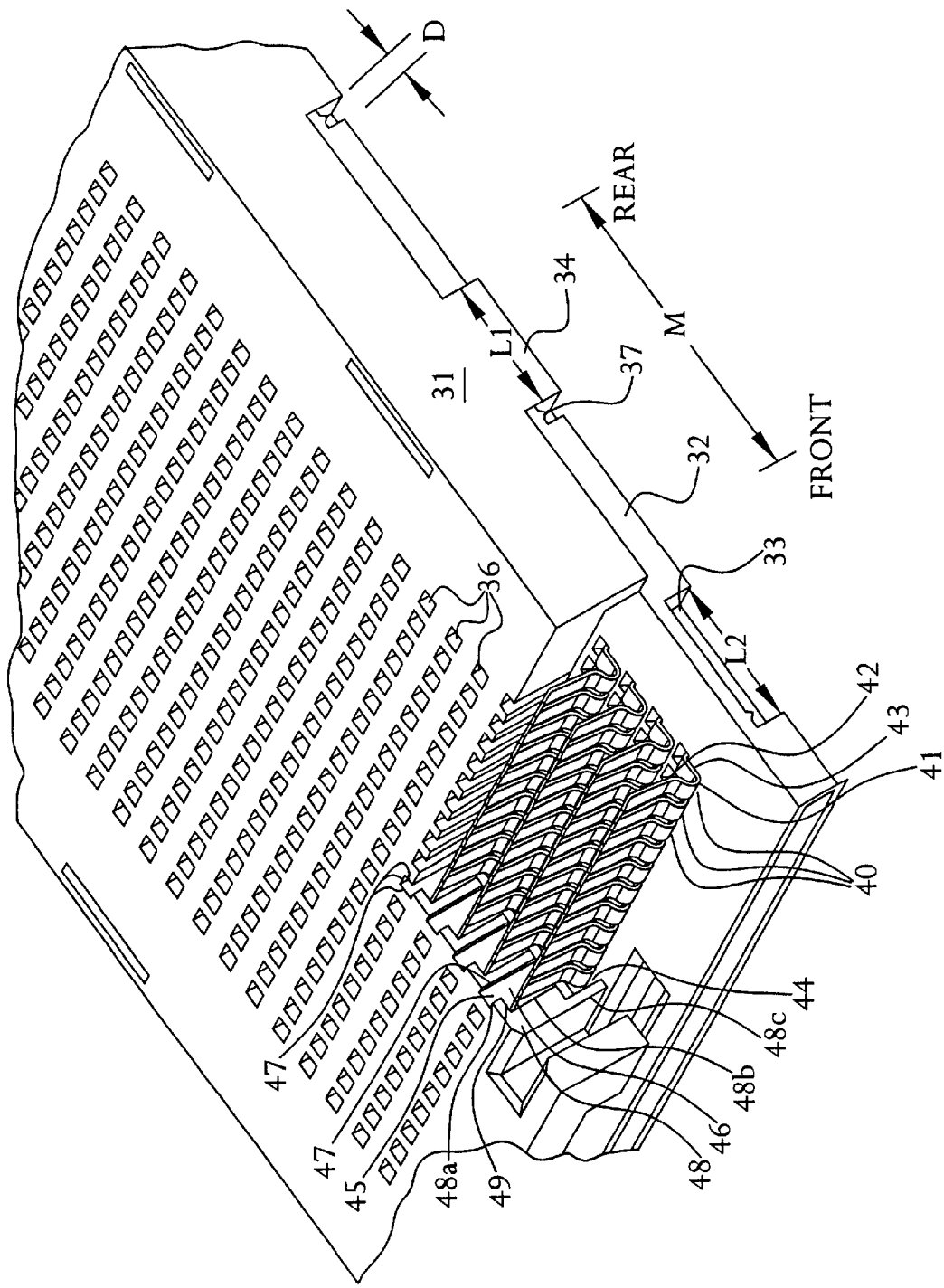
FIG. 7 is a cutaway view of the ZIF socket assembly shown in FIG. 2, with sections taken along lines 5—5 and 7—7.
Figure 8:
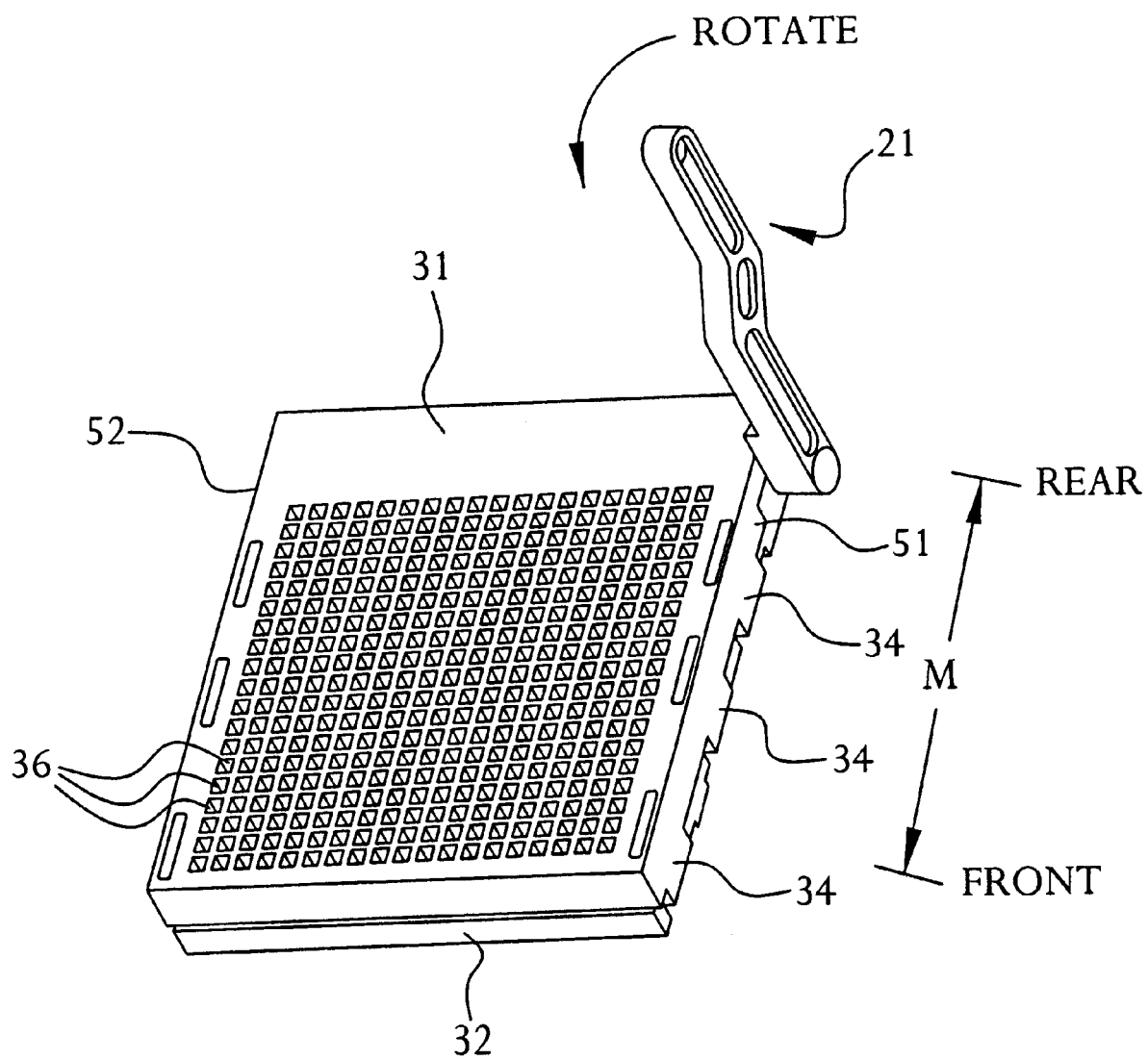
FIG. 8 is a perspective view of an embodiment of a ZIF socket assembly according to the invention, including a handle-driven camming device for transforming the ZIF socket assembly between two positions.

Pin grid array (PGA) package 60 comprises a plurality of pins 61. ZIF socket assembly 10 allows pins 61 to make removable and solderless electrical contact with a circuit board. In order to prepare ZIF socket assembly 10 to receive pin grid array package 60, ZIF socket assembly 10 is placed in the open position that is, top plate 31 is moved to its rearward position along axis M. As can be seen in FIGS. 5 and 7, in the open position of ZIF socket assembly 10, narrow portion 45 of opening 36 is unobstructed because contact 40 is covered by horizontal portion 49 of tiered wall 48, thus permitting narrow portion 45 of opening 36 to receive pin 61 without pin 61 touching contact 40. Because pins 61 do not touch contacts 40 as they are inserted into opening 36, no frictional resistance is encountered during the insertion process.

Because pins 61 do not touch contacts 40 during the insertion process, subsequent to inserting pins 61 into openings 36 it is necessary to move ZIF socket assembly 10 to the closed position in order to obtain electrical contact between pins 61 and contacts 40. ZIF socket assembly 10 is moved to the closed position by applying a force to top plate 31 in the frontward direction along axis M. As top plate 31 moves frontward along axis M, it transports pins 61 along with it. Pins 61, in turn, push against contacts 40 in the frontward direction, thereby causing contacts 40 to deflect toward the front of ZIF socket assembly 10. As contacts 40 deflect, bent upper portion moves such that lower segment 42a is in a generally vertical orientation, parallel to the surface of pin 61. In this position, pin 61 and lower segment 42a of bent upper portion 42 are in physical contact over a continuous portion of each of their lengths, thereby creating a large area of electrical contact which results in a low-resistance (e.g., <20 mΩ) electrical connection between pin 61 and contact 40. It should be noted that this continuous physical connection between contact and pin is in contrast to other ZIP socket assemblies where the contact and pin touch only at a point—the "point" being either at a bend or "elbow" along the contact, or a place at which a straight portion of the contact crosses the pin at approximately right angles. Additionally, as pin 61 is pushed against bent upper portion 42 and deflects toward the front of top plate 31, bend 42b and lower segment 42a of bent upper portion 42 "wipe" against pin 61 before lower segment 42a finally comes to rest against pin 61, thereby removing debris and contaminants from the electrical contact region of both contact 40 and pin 61. Preferably, contact 40 and pin 61 "wipe" against each over a distance of at least 0.010 inches. This "wiping" effect, as well as the long, continuous region of electrical contact, contribute to the low resistance of the electrical connection that is formed between contact 40 and pin 61. The desired force-deflection characteristic and wiping action is achieved by the shape of contact 40, in particular U-shaped portion 41.

While ZIF socket assembly 10 is in the closed position, the bending of contacts 40 biases contacts 40 toward pins 61 (i.e., toward the rear of top plate 31), thereby causing lower segments 42a of bent upper portions 42 to push against pins 61 with a force. This force, in turn, causes a frictional resistance against the removal of pins 61 from openings 36. In order to remove pin grid array package 60 from ZIF socket assembly 10, ZIF socket assembly 10 must be returned to the open position. By moving top plate 31 along axis M in the rearward direction, ZIF socket 10 is returned to the open position that it was in when pins 61 were inserted into openings 36 (shown in FIGS. 2 and 5). In this position, the contacts return to the position they were in when pins 61 were inserted with ZIF socket assembly 10 in the open position. In this open position, there is once again no contact between pins 61 and contacts 40, so there is no longer a frictional resistance against the removal of pins 61 from openings 36. In this open position, pin grid array package 60 can be removed easily from ZIF socket assembly 10.

Contacts 40 are resilient. Therefore, when ZIF socket assembly 10 is in the closed position with pins 61 disposed in openings 36, the bending of contacts 40, as discussed above, causes contacts 40 to push against pins 61 in the rearward direction, thus biasing ZIF socket assembly 10 toward the open position. In one embodiment of the invention, each track 33 could have an anchor 37 along its upper surface, which holds top plate 32 in its closed position against the bias of contacts 40. A notch (not shown) along the upper surface of protrusion 35 receives anchor 37 when guide member 34 is positioned as far forward as it will travel in track 33 (i.e., when top plate 31 is in its most forward position), thereby retaining ZIF socket assembly 10 in the open position by holding top plate 31 in the forward position relative to base plate 32. Guide member 34 is sufficiently resilient that, when a force is applied to top plate 31 along axis M in the rearward direction, guide member 34 yields under the force, thereby permitting guide member 34 to slide past anchor 37 as top plate 31 moves rearward toward the open position.

Two exemplary preferred mechanisms are provided for applying the force along axis M that moves ZIF socket assembly 10 between the open and closed positions.

Figure 9:
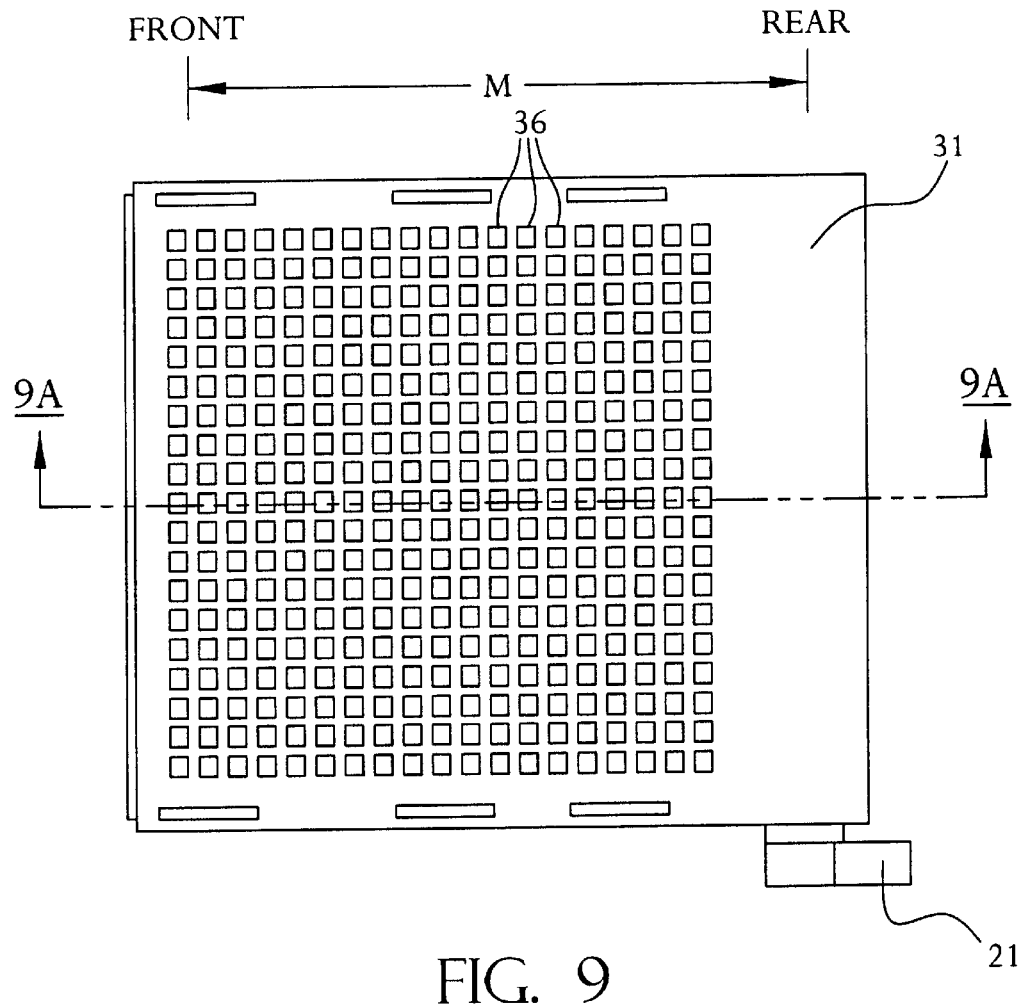
FIG. 9 is a top plan view of the embodiment of the ZIF socket assembly shown in FIG. 7, in its open position.
Figure 9A:
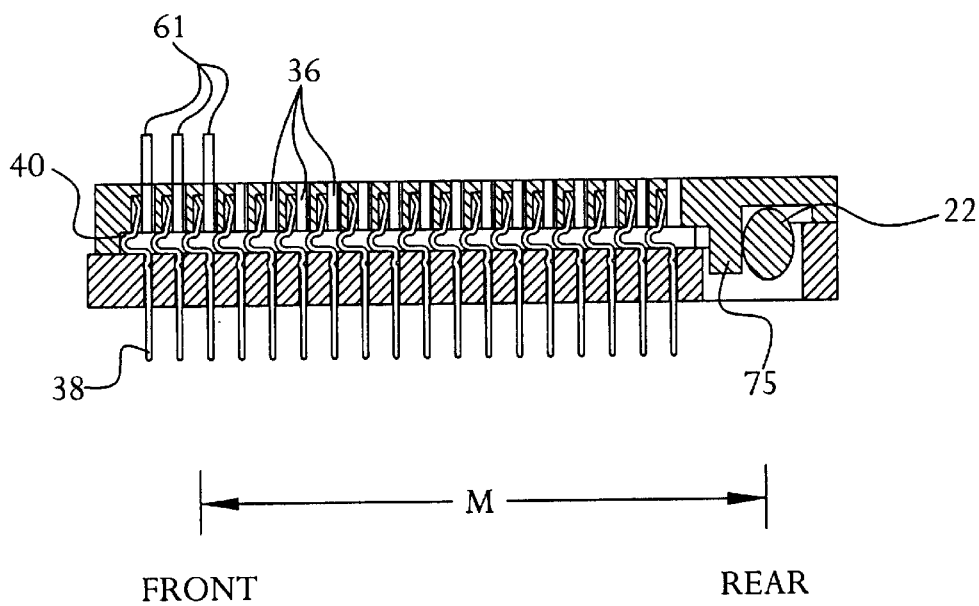
FIG. 9A is a sectional view of the ZIF socket assembly shown in FIG. 9, taken along line 9A—9A.
Figure 10:
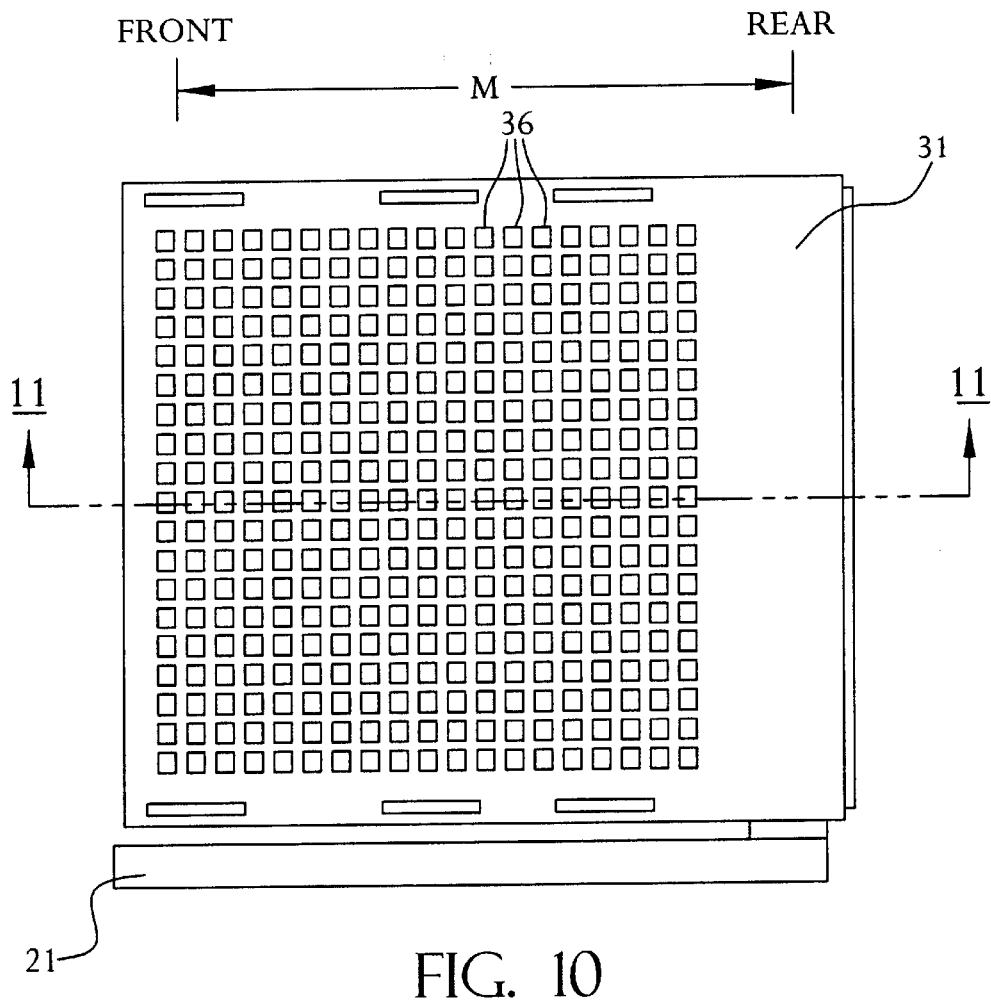
FIG. 10 is a top plan view of the embodiment of the ZIF socket assembly shown in FIG. 7, in its closed position.
Figure 11:
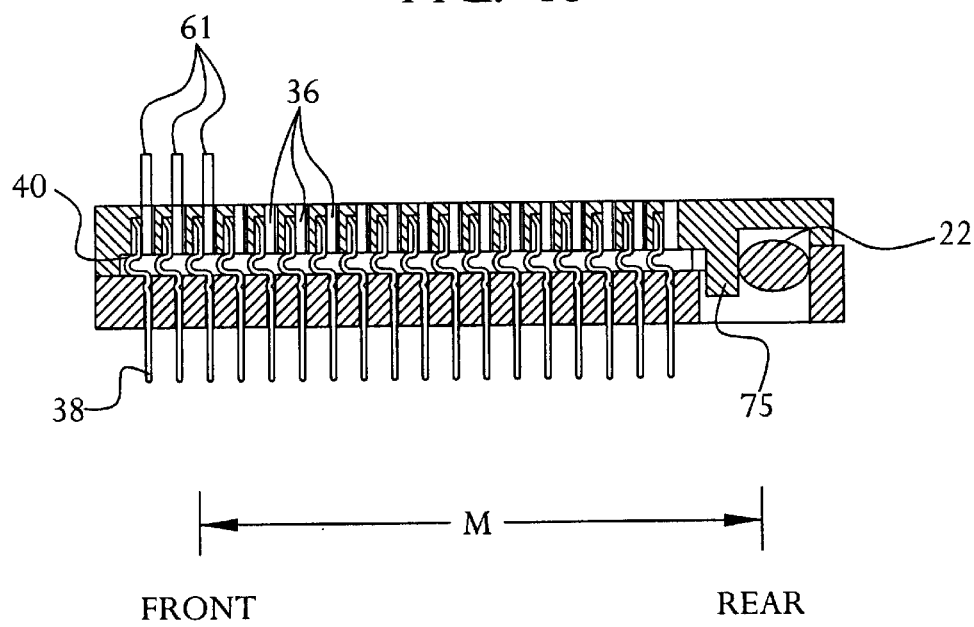
FIG. 11 is a sectional view of the ZIF socket assembly shown in FIG. 10, taken along line 11—11.

In a first preferred embodiment, force is applied to top plate 31 by means of a cam attached to a handle that can be worked manually (as depicted in FIGS. 1 and 8–11). Cam 22 is disposed in a cam-receiving channel 25. Cam-receiving channel 25 is formed along a rear side 39 of base plate 32. Channel 25 comprises a pair of curved recesses 27 disposed on opposing sides of base plate 32, and a larger intermediate portion 28. Channel 25 receives cam 22. Cam 22 comprises a lobe portion 24, and a pair of cylindrical portions 23a and 23b disposed on opposites sides of lobe portion 24. As the sectional views of FIGS. 9A and 11 show, lobe portion 24 has an elliptical or oval profile which protrudes relative to the circular profile of cylindrical portions 23a and 23b. The inner surfaces of curved recesses 27 are complementary in shape and size to the outer surface of cylindrical portions 23a and 23b, so as to permit cam 22 to rotate within channel 25. Intermediate portion 28 of cam-receiving channel 25 is of sufficient shape and size to provide space for lobe portion 24 to rotate within it as cam 22 rotates within channel 25; the rectangular prismatic shape depicted in the drawings is an exemplary shape for intermediate portion 28.

Handle 21 provides means to transmit a torque to cam 22, thereby causing cam 22 to rotate within channel 25. Handle 21 has an arm portion 21a that serves as a lever. A receptacle 29 is formed in handle 21. A distal end of cylindrical portion 23a of cam 22 extends outwardly from cam 22 slightly beyond side 58 of base plate 32. The distal end of cylindrical portion 23a received through receptacle 29 to join cam 22 with handle 21. Receptacle 29 receives the distal end of cylindrical portion 23a snugly, such that cam 22 rotates when handle 21 rotates, with no slippage between cam 22 and handle 21. Slippage may be further preventing by bonding the inner surface of receptacle 29 to the outer surface of the distal end of cylindrical portion 23a. Bonding may be accomplished chemically, thermally, or as otherwise permitted by the materials of which cam 22 and handle 21 are made. Handle 21 provides means to rotate cam 22 from a first position (shown in FIGS. 9 and 9A) to a second position (shown in FIGS. 10 and 11). The first position corresponds to the open position of ZIF socket assembly 10, and the second position corresponds to the closed position of ZIF socket assembly 10. A structure (not shown) could retain handle 21 in the closed position, thereby maintaining the component pins 61 against contacts 40.

A force-transmitting wall 75 is formed in top plate 31 adjacent to cam 22. The lobe portion 24 of cam 22 abuts force-transmitting wall 75. When ZIF socket assembly 10 is in its open position with top plate 31 in its rearward position relative to base plate 32, cam 22 and handle 21 are in their first position. In order to move ZIF socket assembly 10 from the open position to the closed position, handle 21 is rotated from its first position to its second position. This rotation applies a torque to cam 22, causing it to rotate. As it rotates, the orientation of lobe portion 24 changes from that shown in FIG. 9A to that shown in FIG. 11. As lobe portion 24 changes orientation, its protrusion pushes against force-transmitting wall 75 in the frontward direction along axis M, thereby causing top plate 31 to slide forward along axis M relative to base plate 32. When top plate 31 has moved as far forward as it will go (as permitted by the length of track 33), ZIF socket assembly 10 is in its closed position.

As discussed above, when ZIF socket assembly 10 is in the closed position with pins 61 inserted, it is biased toward the open position by resilient contacts 40. ZIF socket assembly 10, however, is retained in the closed position by anchors 37, which, as discussed above, resist the movement of top plate 31 along axis M. In order to return ZIF socket assembly 10 to its open position, a force is applied to top plate 31 along axis M in the rearward direction. As discussed above, the resilience of guide members 34 allows top plate 31 to be dislodged from the grip of anchors 37 when top plate 31 is placed under such a rearward force. After the grip of anchors 37 has been released, the bias toward the open position caused by the resilience of contacts 40 takes over and pushes top plate 31 to its rearward position. During the movement of ZIF socket assembly 10 toward the open position, handle 21 may be manually operated to rotate cam 22 to the orientation shown in FIG. 9A, so it does not abut against force-transmitting wall 75 and prevent top plate 31 from moving rearward.

In another preferred embodiment, there is neither a handle nor a cam. Instead, top plate 31 has a pair of slits 76. A first slit 76 is disposed toward the front of top plate 31, and a second slit 76 is disposed toward the rear of top plate 31. Slits 76 are cut all the way through from the top to the bottom of top plate 31. Additionally a pair of slits 77 are disposed on base plate 32, toward the front and rear, respectively. Base plate slits 77 are in vertical alignment with top plate slits 76 when top plate 31 is disposed over base plate 32 in the frontward (closed) position. When a flat-tip screwdriver 78 is inserted through one of top-plate slits 76 and one of base-plate slits 77, tip 78a rests against an edge of base-plate slit 77. In this way, the edge of base-plate slit 77 acts as a fulcrum, and the shank 78b of screwdriver 78 acts as a lever, which can be used to manually apply force to top plate 31 along axis M. When pin grid array package 60 has been inserted into openings 36 of top plate 31, the force from screwdriver 78 can be used to move top plate 31 to the frontward position against the bias provided by contacts 40, as discussed above. This movement of top plate 31 transforms ZIF socket assembly 10 from the open position to the closed position. ZIF socket assembly is retained in the closed position by the combination of anchors 37 (which, as discussed above, resist the movement of top plate 31 relative to base plate 32 along axis M) and one or more pins 79. Pins 79 are complementary in size and shape to top-plate slits 76 and base-plate slits 77, so as to fit within slits 76 and 77. When pins 79 are inserted through top-plate slits 76 and base-plate slits 77, they help to hold ZIF socket assembly in the closed position against the bias to the open position caused by the resilience of contacts 40. When it is desired to return ZIF socket assembly 10 from the closed position to the open position, pins 79 are removed from slits 76 and 77, and screwdriver 78 can also be used as a lever to apply a force to top plate 31 in the rearward direction along axis M, thus dislodging top plate 31 from the grip of anchors 37 and allowing ZIF socket assembly 10 to return to the open position from the closed position.

It is noted that the foregoing examples have been provided merely for the purpose of explanation and are in no way to be construed as limiting of the present invention. While the invention has been described with reference to preferred embodiments, it is understood that the words which have been used herein are words of description and illustration, rather than words of limitation. Further, although the invention has been described herein with reference to particular means, materials and embodiments, the invention is not intended to be limited to the particulars disclosed herein; rather, the invention extends to all functionally equivalent structures, methods and uses, such as are within the scope of the appended claims. Those skilled in the art having the benefit of the teachings of this specification, may effect numerous modifications thereto and changes may be made without departing from the scope and spirit of the invention in its aspects.

What is claimed is:

1. A socket assembly for electrically connecting an electronic component having male contacts to a circuit substrate, said socket assembly comprising:

a base having a first plurality of openings arranged in a pattern;

a cover having a second plurality of openings arranged in said pattern to receive the male contacts, said cover being slidably disposed over said base plate so as to be movable between a first position and a second position; and a plurality of base contacts, each one of said base contacts being disposed in one of said first plurality of openings such that each opening has a contact; wherein said base contacts and said male contacts are in physical contact for a continuous length along their respective surfaces when said male contacts are inserted in said first openings and said cover is moved from said first position to said second position, wherein each of said base contacts comprises a bent portion adjacent to said cover, said bent portion having a lower section and an upper section joined at a bend, and wherein the physical contact between said male contacts and said base contacts is made at the lower section of said bent portion.

2. The socket assembly of claim 1, wherein each of said base contacts further comprises a U-shaped portion, and wherein the lower section of said bent portion extends from said U-shaped portion.

3. The socket assembly of claim 2, wherein said U-shaped portion has two arms and a bent section, wherein one arm extends adjacent to and generally parallel with said base.

4. A socket assembly for electrically connecting an electronic component having male contacts to a circuit substrate, said socket assembly comprising:

a base having a first plurality of openings arranged in a pattern;

a cover having a second plurality of openings arranged in said pattern to receive the male contacts, said cover being slidably disposed over said base plate so as to be movable between a first position and a second position; and a plurality of base contacts, each one of said base contacts being disposed in one of said first plurality of openings such that each opening has a contact; wherein said base contacts and said male contacts are in physical contact for a continuous length along their respective surfaces when said male contacts are inserted in said first openings and said cover is moved from said first position to said second position, wherein each of said second plurality of openings comprises a tiered wall which covers said contacts when said cover is in said first position, said wall preventing said male contacts and said base contacts from coming into contact while said male contacts are being inserted into said second plurality of openings with said cover in said first position.

5. A zero insertion force socket assembly for receiving a pin grid array package with pins arranged in a pattern, said socket assembly being movable between a first position and a second position, said socket assembly comprising:

a plurality of contacts arranged in said pattern; and a plate having a plurality of apertures arranged in said pattern, said pins being receivable in said apertures;

wherein said contacts do not touch said pins when said socket assembly is in said first position, wherein said contacts are in electrical connection with said socket assembly is in said second position, and wherein said contacts wipe against said pins through at least some of the electrical contact region between said contacts and said pins as said socket assembly moves from said first position to said second position, wherein said contacts and said pins are in physical contact for a continuous length along their respective surfaces when said socket assembly is in said second position, and wherein each of said contacts comprises a bent portion having a lower section and an upper section joined at a bend, and wherein the physical contact between said pins and said contacts is made at the lower sections of said bent portion.

6. The socket assembly of claim 5, wherein each of said contact further comprises a U-shaped portion, and wherein said the lower section of said bent portion extends from said U-shaped portion.

7. The socket assembly of claim 6, wherein said U-shaped portion has two arms and a bent section, wherein one arm extends adjacent to and generally parallel to said base.

8. A zero insertion force socket assembly for receiving a pin grid array package with pins arranged in a pattern, said socket assembly being movable between a first position and a second position, said socket assembly comprising:

a-plurality of contacts arranged in said pattern; and a plate having a plurality of apertures arranged in said pattern, said pins being receivable in said apertures;

wherein said contacts do not touch said pins when said socket assembly is in said first position, wherein said contacts are in electrical connection with said socket assembly is in said second position, and wherein said contacts wipe against said pins through at least some of the electrical contact region between said contacts and said pins as said socket assembly moves from said first position to said second position, and wherein each of said apertures comprises a tiered wall which covers said contacts when said socket assembly is in said first position, said wall preventing said pins and said contacts from coming into contact while said pins are being inserted into said socket assembly when said socket assembly is in said first position.

9. A zero insertion force socket assembly for electrically connecting an electrically conductive object to a pin grid array package having pins arranged in a pattern, said zero insertion force socket assembly being transformable between two positions and comprising:

a plurality of contacts arranged in said pattern; and a plate having a plurality of sockets arranged in said pattern, said pins of said pin grid array package being receivable in said sockets;

wherein said pins encounter substantially no resistance to their insertion when the assembly is in a first of said two positions, wherein said pins are in electrical contact with said contacts when the assembly is in a second of said two positions, and wherein said pattern comprises a rectangular grid pattern with centers spaced 0.040 to 0.060 inches apart, wherein said contacts and said pins are in physical contact for a continuous length along their respective surfaces when the assembly is in said second position, and wherein each of said contacts comprises a bent portion having a lower section and an upper section joined at a bend, and wherein the physical contact between said pins and said contacts is made at the lower sections of said bent portions.

10. The zero insertion force socket assembly of claim 9, wherein each of said contacts further comprises a U-shaped portion, wherein said bent portion extends from said U-shaped portion.

11. The zero insertion force socket assembly of claim 10, wherein said U-shaped portion has two arms and a bent section, wherein one arm extends adjacent to and generally parallel to said base.

12. A zero insertion force socket assembly for electrically connecting an electrically conductive object to a pin grid array package having pins arranged in a pattern, said zero insertion force socket assembly being transformable between two positions and comprising:

a plurality of contacts arranged in said pattern; and a plate having a plurality of sockets arranged in said pattern, said pins of said pin grid array package being receivable in said sockets;

wherein said pins encounter substantially no resistance to their insertion when the assembly is in a first of said two positions, wherein said pins are in electrical contact with said contacts when the assembly is in a second of said two positions, and wherein said pattern comprises a rectangular grid pattern with centers spaced 0.040 to 0.060 inches apart, and wherein each of said sockets comprises a tiered wall which covers said contacts when the assembly is in said first position, said wall preventing said pins and said contacts from coming into contact while said pins are being inserted into said socket with the assembly in said first position.

* * * * *